(12) United States Patent
Gruenhagen et al.

(10) Patent No.: US 8,598,035 B2
(45) Date of Patent: Dec. 3, 2013

(54) SEMICONDUCTOR DICE WITH BACKSIDE TRENCHES FILLED WITH ELASTIC MATERIAL FOR IMPROVED ATTACHMENT, PACKAGES USING THE SAME, AND METHODS OF MAKING THE SAME

(75) Inventors: Michael D. Gruenhagen, Salt Lake City, UT (US); Suku Kim, South Jordan, UT (US); James J. Murphy, South Jordan, UT (US); Eddy Tjhia, Sunnyvale, CA (US); Chung-Lin Wu, San Jose, CA (US); Mark Larsen, Sandy, UT (US); Douglas E. Dolan, York, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 370 days.

(21) Appl. No.: 13/151,495

(22) Filed: Jun. 2, 2011

(65) Prior Publication Data

US 2011/0230046 A1  Sep. 22, 2011

Related U.S. Application Data

(62) Division of application No. 12/334,331, filed on Dec. 12, 2008, now Pat. No. 7,960,800.

(51) Int. Cl.
*H01L 21/44* (2006.01)

(52) U.S. Cl.
USPC .... 438/669; 438/284; 438/652; 257/E21.158; 257/341; 257/678

(58) Field of Classification Search
USPC ............ 257/E23.06, E23.031, E21.585, 257/E21.158, 341, 401, 417, 673, 675, 678, 257/666, 738, 782, 796; 438/669, 673, 106, 438/109, 112, 118, 284, 286, 652
See application file for complete search history.

(56) References Cited

U.S. PATENT DOCUMENTS

| | | | |
|---|---|---|---|
| 3,761,782 A | 9/1973 | Youmans | |
| 5,496,755 A * | 3/1996 | Bayraktaroglu | 438/167 |
| 5,511,428 A * | 4/1996 | Goldberg et al. | 73/777 |
| 5,650,918 A | 7/1997 | Suzuki | |
| 6,033,489 A | 3/2000 | Marchant et al. | |
| 6,104,062 A * | 8/2000 | Zeng | 257/341 |
| 6,124,179 A * | 9/2000 | Adamic, Jr. | 438/309 |
| 6,373,100 B1 | 4/2002 | Pages et al. | |
| 6,392,290 B1 | 5/2002 | Kasem et al. | |
| 6,653,740 B2 | 11/2003 | Kinzer et al. | |
| 6,747,360 B2 | 6/2004 | Fukuizumi et al. | |
| 6,812,554 B2 | 11/2004 | Hirashima et al. | |
| 6,849,930 B2 | 2/2005 | Nakajima et al. | |
| 6,858,471 B1 * | 2/2005 | Korec et al. | 438/113 |
| 6,921,718 B2 * | 7/2005 | Andoh et al. | 438/699 |
| 6,963,133 B2 | 11/2005 | Teshima | |
| 7,102,207 B2 * | 9/2006 | Inoue et al. | 257/656 |
| 7,132,321 B2 * | 11/2006 | Kub et al. | 438/172 |

(Continued)

*Primary Examiner* — Chris Chu
(74) *Attorney, Agent, or Firm* — Kenneth E. Horton; Kirton McConkie

(57) ABSTRACT

Disclosed are semiconductor dice with backside trenches filled with elastic conductive material. The trenches reduce the on-state resistances of the devices incorporated on the dice. The elastic conductive material provides a conductive path to the backsides of the die with little induced stress on the semiconductor die caused by thermal cycling. Also disclosed are packages using the dice, and methods of making the dice.

10 Claims, 4 Drawing Sheets

(56) References Cited

U.S. PATENT DOCUMENTS

| | | |
|---|---|---|
| 7,160,760 B2 | 1/2007 | Hirashima et al. |
| 7,227,242 B1 * | 6/2007 | Lin et al. ............... 257/618 |
| 7,374,965 B2 | 5/2008 | Muto et al. |
| 7,408,251 B2 | 8/2008 | Hata et al. |
| 7,589,400 B2 | 9/2009 | Hozoji et al. |
| 7,736,966 B2 | 6/2010 | Dyer et al. |
| 7,834,461 B2 * | 11/2010 | Asai et al. ............... 257/774 |
| 8,058,732 B2 * | 11/2011 | Gruenhagen et al. ...... 257/774 |
| 8,067,313 B2 * | 11/2011 | Nakamura ............... 438/714 |
| 8,304,916 B1 * | 11/2012 | Sarkozy et al. ........... 257/774 |
| 2005/0263859 A1 * | 12/2005 | Kime et al. .............. 257/659 |
| 2006/0226451 A1 | 10/2006 | Davies |
| 2006/0226498 A1 | 10/2006 | Davies |
| 2007/0045779 A1 | 3/2007 | Hiatt |
| 2007/0090434 A1 | 4/2007 | Davies et al. |

* cited by examiner

SEMICONDUCTOR DICE WITH BACKSIDE TRENCHES FILLED WITH ELASTIC MATERIAL FOR IMPROVED ATTACHMENT, PACKAGES USING THE SAME, AND METHODS OF MAKING THE SAME

CROSS-REFERENCES TO RELATED APPLICATIONS

This application is a divisional patent application of U.S. patent application Ser. No. 12/334,331, filed Dec. 12, 2008, the disclosure of which is incorporated by reference in its entirety for all purposes.

BACKGROUND OF THE INVENTION

Power semiconductor die are packaged in various leadframe packages that are constructed to handle large currents switched by the dice, and the large amounts of heat generated by the dice. A typical transistor power semiconductor die has a control terminal and a first current-conducting terminal on the "top" surface of the die, and a second current-conducting terminal on the "bottom" surface of the die. The device may be mounted to the leadframe with its top surface facing up, or with its bottom surface facing up. In the former case, the bottom surface of the device is attached to a die attach region of the leadframe, and wire bonds are used to interconnect the terminals at the die's top surface to leads of the leadframe. In the latter case, the terminals at the die's top surface are flip-chip bonded to leads and/or tabs of the leadframe, and a die clip is used to interconnect the terminal at the die's bottom surface to a tab of the leadframe. There is ever increasing demand to increase the amount of power that can be switched by power semiconductor die. However, this would increase the amount of heat generated by the die, and current die packages are limited in the amount of heat they can dissipate without using complex designs. One way to reduce the heat generated by a power semiconductor device is to reduce the length of the electron drift region of the die, which may be done by thinning the device. However, this weakens the die's ability to handle the thermal stresses induced by handling large amounts of power, and often results in the cracking of the die and shorted lifetimes.

BRIEF SUMMARY OF THE INVENTION

As part of making their invention, the inventors have recognized that the effective length of a die's drift region can be reduced by forming one or more trenches in the backside of the die, with mesa regions disposed on either side of each trench, and by forming a conductive layer on the die's back surface that electrically connects the bottoms and sides of the trenches to the remaining back surface. The bottoms and sides of the trenches are located closer to the top surface of the die than the bottom surface, and thereby effectively reduce the length of the electron drift region. As also part of making their invention, the inventors have further recognized that the voids created at the back surface of the die create air pockets in the conductive mounting adhesive that is used to attach the back surface to a die attach region of a leadframe, or to a die clip, and that such air pockets create hot spots and failure points. The inventors have solved these problems by filling the trench voids with an elastic conductive material that is more elastic than the die's semiconductor substrate. The elastic conductive material may have a planar surface at the trench.

A first general exemplary embodiment according to the present invention is directed to semiconductor die comprising a semiconductor substrate having a first surface, a second surface opposite to the first surface, and a material elasticity. The exemplary semiconductor die further comprises a trench disposed at the second surface of the semiconductor substrate, the trench having a surface that is spaced from the substrate's first surface by at least a first distance, and a semiconductor device region disposed between the substrate's first surface and the trench. The semiconductor device region has a first electrode at the substrate's first surface and a second electrode adjacent to the trench. The exemplary semiconductor die further comprises an electrically conductive layer disposed over trench's surface and a portion of the substrate's second surface, the second electrically conductive layer having a material elasticity that is greater than the substrate's material elasticity.

A second exemplary embodiment according to the present invention is directed to a method of making a semiconductor die comprising a semiconductor substrate having a first surface, a second surface opposite to the first surface, a semiconductor device region extending from the first surface toward the second surface, and at least one electrode disposed at the first surface. The exemplary method comprises forming at least one trench at the second surface of the semiconductor die, the trench extending toward the semiconductor device region; and forming an electrically conductive layer over the at least one trench and the second surface of the semiconductor substrate, the electrically conductive layer comprising a polymer.

A third exemplary embodiment according to the present invention is directed to a method of making a semiconductor die comprising a semiconductor substrate having a first surface, a second surface opposite to the first surface, a semiconductor device region extending from the first surface toward the second surface, and at least one electrode disposed at the first surface. The exemplary method comprises forming at least one trench at the second surface of the semiconductor die, the trench extending toward the semiconductor device region; forming a first electrically conductive layer over the at least one trench and the second surface of the semiconductor substrate, the electrically conductive layer comprising a metal; and forming a second electrically conductive layer over the first electrically conductive layer, the electrically conductive layer comprising a polymer and having a greater material elasticity than the first electrically conductive layer.

The above exemplary embodiments and other embodiments of the inventions are described in the Detailed Description with reference to the Figures. In the Figures, like numerals may reference like elements and descriptions of some elements may not be repeated.

DETAILED DESCRIPTION OF THE INVENTION

Figure 1:
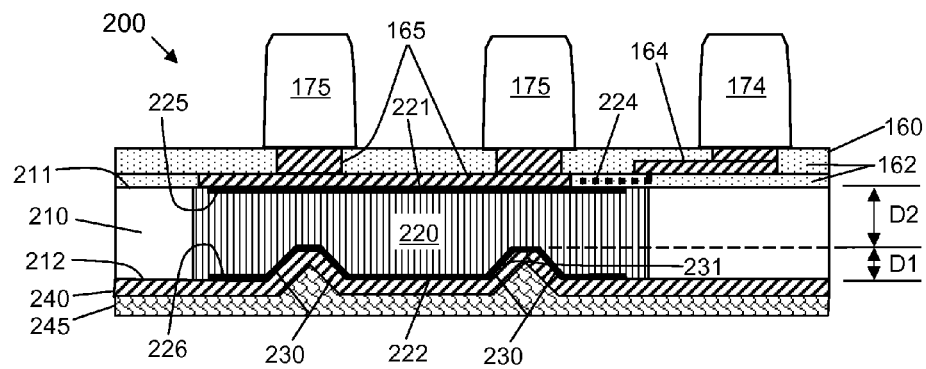
FIG. 1 shows a cross sectional view of an exemplary semiconductor die package according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

FIG. 1 shows a cross section of an exemplary embodiment 200 of a semiconductor die according to a second invention of the present application, with an optional set of solder bumps disposed thereon (as explained below in greater detail). Semiconductor die 200 has the form of a conventional vertical power device, and may be mounted to a leadframe and interconnected thereto in a flip-chip orientation with a die clip, or a die-bonded orientation with interconnect wires disposed between die 200 and the leadframe. Semiconductor die 200 comprises a semiconductor body 210 (e.g., semiconductor substrate) having a first surface 211 and a second surface 212 opposite to first surface 211, and a semiconductor device region 220 disposed at the die's first surface 211 and extending toward the die's second surface 212. Semiconductor device region 220 has a first surface 221 disposed at the die's first surface 211, a second surface 222 disposed adjacent to the die's second surface 212, and two or more electrodes disposed on the surfaces of device region 220. An electrode may comprise a portion of semiconductor body 210 (such as a doped region), a conductive layer directly disposed on a surface of semiconductor body or spaced therefrom by a dielectric layer, or other conventional electrode structures known to the semiconductor art. Semiconductor device region 220 may be configured as a rectifier of any type (two electrodes), a transistor of any type (three electrodes), or combination thereof, or any other type of power semiconductor device.

For the purpose of illustration, and without loss of generality, semiconductor device region 220 is illustrated herein as comprising a vertical MOSFET transistor having a gate electrode 224 and a source electrode 225 disposed at a first surface 221 of device region 220, and a drain electrode 226 at second surface 222 of device region 220. Gate electrode 224 is disposed behind the plane of the figure cross section and is schematically shown by a dashed line. Portions of source and drain electrodes 225-226 lie in the cross section and are schematically shown by respective solid lines. Gate electrode 224 may comprise a conductive layer spaced from a surface of semiconductor body 210 by a dielectric layer, and electrodes 225 and 226 may comprise doped regions of semiconductor body 210. The gate electrode is an example of a control or modulation electrode. The source and drain electrodes are examples of current conducting electrodes. In general, semiconductor device region 220 comprises the semiconductor material of body 210 and may further comprise doped regions, electrodes, dielectric layers, shallow trenches (typically less than 2 microns in depth) at first surface 221, and/or other device features to provide the desired device.

Semiconductor die 200 further comprises a plurality of trenches 230 disposed at the die's second surface 212. Each trench 230 has a depth D1 with a surface 231 that abuts drain electrode 226 and that is spaced from the die's first surface 211 by at least a distance D2. Semiconductor die 200 further comprises a first electrically conductive layer 240 disposed on trench surface 231 and a portion of the die's second surface 212 (e.g., the drain electrode 226). Layer 240 may be disposed on additional portions of the die's second surface 212. Layer 240 may comprise one or more metals, disposed together and/or in sub-layers. Copper may be used. It may have a thickness in the range of 0.5 microns to 5 microns, or more. The thickness of layer 240 is preferably equal to or less than 30 microns.

The present invention may be applied to low power devices having relatively low breakdown voltages. These devices typically use shallow electrode trenches (e.g., 0.75 microns deep), and the device region 220 can be made as thin as about 1 micron (with at least 0.25 microns of buffer space below the trenches), and depth D1 may be as deep as the thickness of the die minus 1 micron. That is, the trench depth D1 may reach to a point just below the active device structure in device region 220. The present invention may also be applied to high power device with high and super-high breakdown voltages. These devices typically use deep trenches in the range of several microns to 25 microns (~1 mil). These devices should have significantly larger amounts of buffer space below the trenches to provide mechanical strength against thermal stress, and their device regions 220 are significantly thicker (e.g., more than 2 mils). Accordingly, an exemplary semiconductor die 210 may have a thickness of 1 mil to 25 mils (~25.4 to ~635 microns), semiconductor device region 220 may have a thickness (D2) of 0.04 mil to 24 mils (~<1 micron to ~609.6 microns), and trench 230 may have a depth D1 of 3 mils to 24.96 mils (~75 to ~633.98 microns). The length of trench 230 may be 0.5 millimeters to several millimeters (e.g., 2 to 5 millimeters) in length, and the width of trench may be 0.1 millimeters to 3 millimeters (as measured at second surface 212).

Semiconductor die 200 further comprises a second electrically conductive layer 245 disposed on first conductive layer 240. Second conductive layer 245 has a material elasticity that is greater than the material elasticity of semiconductor die 210, and greater than the material elasticity of first conductive layer 240. Second conductive layer 245 may comprise a metal filled polymer, such as silver filled epoxy (e.g., "silver paste"). Second conductive layer 245 is more elastic than the material of semiconductor body 210, and more elastic than the material of conductive layer 240, thereby minimizing the stress and strain that it may apply to trenches 230 during thermal cycling of the device. Conductive material layer 245 is more elastic than each of the following materials: silicon, copper, aluminum, and gold. Second conductive layer 245 may be formed by one or more spin coating processes, with interleaving planarization operations. Second conductive layer 245 may be maintained in an uncured or partially cured state so that a die clip, leadframe die paddle, or the like may be adhered to it, and cured after being adhered. This enables die 200 to be assembled with a die paddle or die clip (at its second surface 212) without the use of solder.

Material elasticity is often specified with the Young's Modulus. The Young's Modulus actually measures stiffness, and is inversely related to elasticity. More elastic materials have lower values of Young's Modulus. Typical silver paste (e.g., silver filled epoxy) has a Young's Modulus in the range of 0.3 to 5 GPa (gigapascals, $kN/mm^2$), while silicon has a Young's Modulus of 150 GPa. The Young's modulus of the common interconnect metals aluminum, copper, and gold are 70 GPa, 120 GPa to 128 GPa, and 78 GPa, respectively. Because the Young's Modulus of silver paste is less than the Young's Moduli of silicon, aluminum, copper, and gold, its material elasticity is greater than the material elasticity of these elements. The Young's Modulus of common PbSn solder is around 30 GPa. In general, the Young's Modulus of second conductive layer is equal to or less than 10 GPa.

Figure 2:
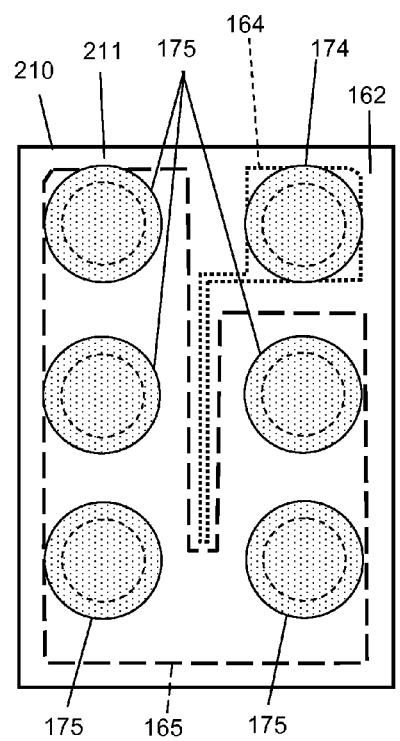
FIG. 2 shows a top plan view of the semiconductor die package shown in FIG. 1 according to the present invention.
Figure 3:
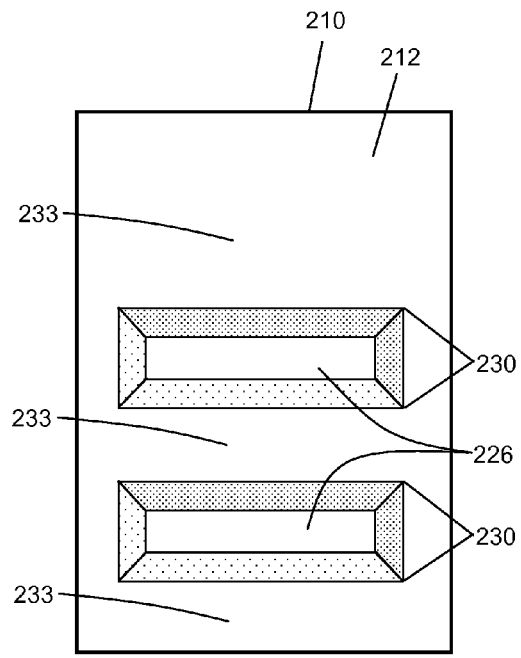
FIG. 3 shows a bottom plan view of the substrate element of the semiconductor die package shown in FIG. 1 according to the present invention.

FIG. 2 shows a top plan view of semiconductor die package 200. There are five source bumps 175 and one gate bump 174. Redistribution traces 164 and 165 are shown in dashed lines and they lie below top dielectric layer 162. FIG. 3 shows a bottom plan view of semiconductor die package 200 before first and second conductive layers 240 and 245 are disposed on second surface 212 of die 210. Two trenches 230 are shown. The semiconductor device area 220 is located below drain electrodes 226. There are three mesas 233 interleaved between the two trenches 230. Mesas 233 provide structural stability to semiconductor die 210 and minimize the amount of its warping from the heat generated by the device. Mesas 233 have lengths that are equal to or greater than the lengths of trenches 230, and have typical widths of 0.5 mm to 4 mm (or more). In comparison, a thin semiconductor die without trenches 230 and mesas 233, but having a thickness equal to D2 and a thick backside metal layer (to get the same low resistance of the present invention), would warp significantly from the heat generated by the device, and crack. This is due to the mismatch in coefficients of thermal expansion of the metal and semiconductor materials, and the thinness of such a semiconductor die. In addition, the use of elastic conductive material 245 in device 200 enables conductive layer 240 to be made relatively thin, thereby enabling layer 240 to be made thinner to further reduce the stresses and warping caused by the mismatch in the coefficients of thermal expansion of the materials. While elastic conductive layer 245 may have a coefficient of thermal expansion (CTE) that is different from that of layer 240 and semiconductor die 210, its lower bulk elasticity reduces the amount of stress forces that it can exert on die 210. That is, the bulk elasticity of conductive layer 240 is less than the bulk elasticity of each of silicon, copper, aluminum, and gold.

In another implementation of package 200, the electrically conductive member may comprise second layer 245 of elastic electrically conductive material, but not conductive layer 240. In this implementation, second layer 245 is directly disposed on the surfaces of trenches 230, and electrode 226 of the device region 220. While this implementation does not provide an on-state resistance that is as low as the implementation that uses both layers 240 and 245, it can be made by a more simple processing method, and can be suitable for many device applications.

The construction of die 200 provides several advantages. As a first advantage, trenches 230 lower the on-state resistance of the power semiconductor device by reducing the thickness of device region 220 in selected areas, with the mesa regions 233 between the trenches preventing die 200 from warping from the generation of heat by the device. As a second advantage, layer 245 may provide a lower resistance than solder in the connection between die 200 and the surface to which the die is mounted. This further lowers on-state resistance. As a third advantage, the spin coat formation and planarization of second conductive layer 245 enables die 200 to be mounted on a surface (e.g., die paddle, die clip) with little or no air bubbles (e.g., voids) between layer 245 and the surface. Such air bubbles would create localized hot spots during chip temperature cycling, and these hot spots would cause cracking of the die, and delamination of the die from the mounting surface. If a traditional die attachment process were used, a round dot of die attach material (epoxy or solder) would first be placed on the mounting surface, then the die would be disposed on the die-attach material, and then the assembly would have to be vibrated to help the die attach material fill into trenches 230. However, the vibration action would not completely fill the trenches. In contrast, the trenches are completely filled in this invention before the die is mounted.

As a fourth advantage, layer 245 provides complete coverage of the die's corners when attaching the die to the mounting surface. In contrast, the round dot of die-attach material used in the traditional mounting methods causes voids at the corners of the die because the round geometry of the dot does not fit the rectangular shape of the die. As a result the die corners in the traditional method are unsupported, leading to die cracking at the corners. As a fifth advantage, layer 245 has a minimal amount of "bleed out" on the mounting surface when mounted, generally less than 0.5 mils ("bleed out" is the movement of material away from the die during the mounting operation). This is significantly less than the bleed out experienced with solder die attach methods, and allows the die paddle area to be decreased and the package made smaller. As a sixth advantage, the high elasticity of layer 245 provides shock dampening from stresses experienced during die drop tests, and reduces the chances of die cracking in high stress areas, especially at the apexes of localized thinned areas of the die. As a seventh advantage, die 200 can be easily grasped at layer 245 by conventional die pickup tools used in leadframe mounting and board mounting tasks, despite the presence of trenches 230. These tools use a vacuum to grasp the die at a handling collet. Prior art die with backside trenches or cavities present a challenge for die pickup tools as they cause a loss of this vacuum, unless a special and expensive collet is used with the tool. Thus, this invention provides die with trenches that are more readily useable with conventional mounting tools.

To provide semiconductor die package 200 in the form of wafer-level chip scale package, a packaging layer 160 and interconnect bumps 174-175 may be added. Interconnect layer 160 comprises electrically insulating dielectric layers 162 and a plurality of electrically conductive redistribution traces 164-165 embedded in dielectric layer 162. Trace 164 is electrically coupled to gate electrode 224 and gate interconnect bump 174; trace 165 is electrically coupled to source electrode 225 and source interconnect bumps 175. Traces 164-165 perform the task of routing connections from the device electrodes to the locations of the interconnect bumps, which is determined by packaging considerations. Layer 162 provides an electrically insulating layer for the package surface that is mechanically and thermally durable and that can withstand the forces and temperatures encountered in mounting the wafer-level chip scale package to an interconnect board.

Figure 4:
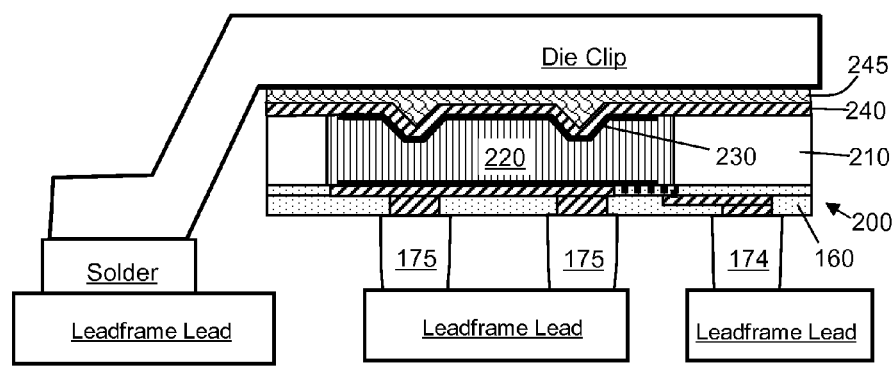
FIGS. 4 and 5 illustrate packaging applications of an exemplary semiconductor die package according to the present invention.
Figure 5:
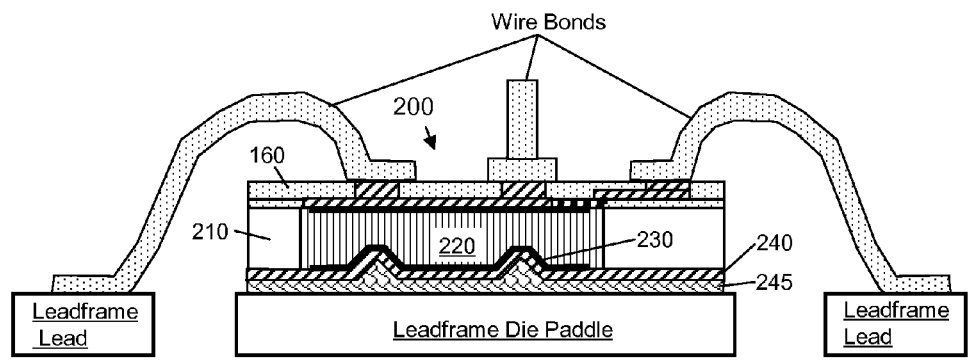

FIG. 4 illustrates a package application where semiconductor die 200 is flip-chip mounted to leads of a lead frame, with a die clip attached to layer 245 at the backside of die 200. The above wafer-level chip scale packaging provided by packaging layer 160 and interconnect bumps 174-175 allows die 200 to be directly mounted to an interconnect substrate (or the like) with a die clip added to connect its backside. This enables die 200 to be mounted to an interconnection substrate with other similar die and control chips in a very compact manner. The die clip can also serve as a heat sink. FIG. 5 illustrates a package application where semiconductor die 200 is die-bonded to a die paddle of a leadframe, with wire bonds being used to interconnect the terminals of the device to leads of the leadframe. In the latter application, interconnect bumps 174 and 175 are not needed.

Figure 6:
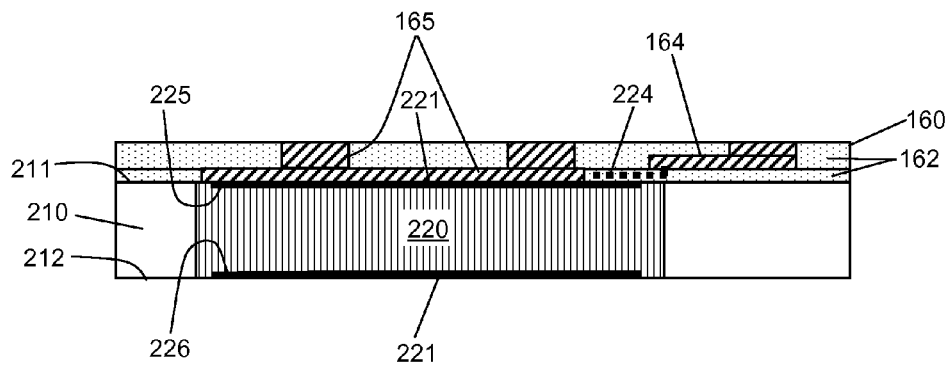
FIGS. 6-14 show cross sectional views of an exemplary semiconductor die during manufacturing by exemplary methods according to the present invention.

An exemplary method of manufacturing an exemplary semiconductor die 200 is illustrated with reference to FIGS. 6-10. Referring to FIG. 6, a plurality of device regions 220 are manufactured on a semiconductor wafer, one of which is shown in the figure. The wafer provides the semiconductor body 210 of the die. The device regions 220 may be manufactured to provide any of the above types of power devices, including rectifiers and transistors. Other than having a bottom electrode 226 and one or more top electrodes (224 and/or 225), the particular configuration of device region 220 is not important for practicing this invention of the present application.

Packaging layer 160 may be formed now or at a later stage by conventional layer deposition and etching actions. For example, a first dielectric layer 162 may be formed on surface 211 and then patterned with apertures that provide connection points to electrodes 124-125. Then, a conductive layer may be formed over the first dielectric layer 162 and patterned to provide the lower portions of traces 164-165. Thereafter, a second dielectric layer 162 may be formed over the lower trace portions and the first dielectric layer 162, and patterned to form connection apertures at locations where bumps 174-175 are to be formed. A layer of metal may then be disposed in the connection apertures. A metal lift-off process may be used for this, which may use the same mask used to define the connection apertures. The top portions and other portions of traces 164-165 may comprise copper. At this point, or at a subsequent point in time, the top portions of traces 164-165 may be treated to form a conventional underbump metal finish, which can later facilitate the formation of bumps 174-175 on the traces by a ball drop process. Conventional underbump metal finishes include titanium-nickel-silver (Ti—Ni—Ag), titanium-nickel-copper (Ti—Ni—Cu), titanium-sputtered copper-plated copper (Ti—Cu—Cu), aluminum-nickel-silver (Al—Ni—Ag), as well as others. Currently, an electroless nickel immersion gold process (ENIG) is preferred for a durable finish.

Figure 7:
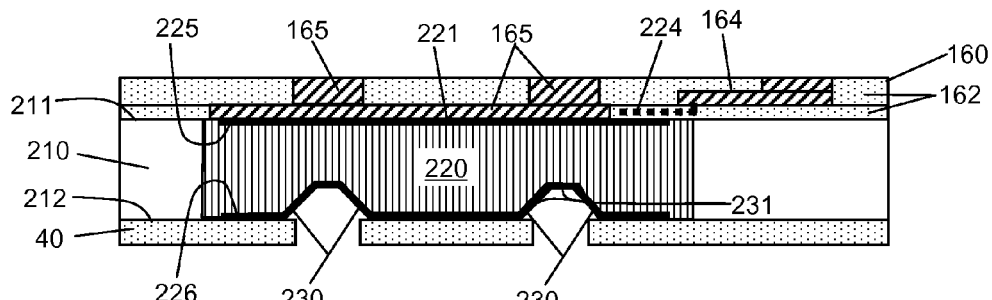

Referring to FIG. 7, the exemplary method further comprises forming trenches 230. This action may comprise masking the top surface of the die, disposing a layer 40 of photoresist on the second surface 212 of die body 210, exposing the photoresist to patterned actinic radiation to define the locations where trenches 230 are to be formed, developing the exposed photoresist layer 40, and thereafter etching the exposed portions of die body 210 with an etchant. The top surface of the die may be masked by a blanket layer of unexposed positive-tone photoresist or a temporary spin-on wet-etch protective layer, such as a ProTEK coating from Brewer Science. A commercially available wafer-backside aligner and alignment method may be used to align the patterns in photoresist layer 40 for trenches 230 to the device regions 220. Exemplary manufacturers selling such aligners are SUSS MicroTec and EVGroup. Backside alignment methods generally use special alignment marks on the top surface of the wafer (same as first surface 211), which are provided by the equipment manufacturer. An isotropic etchant may be used, such as the conventional combination hydrofluoric acid, nitric acid, and acetic acid (HNA). This etchant can provide an etch rate of 40 to 50 microns per minute. The photoresist layer(s) may then be removed with a photoresist solvent, as is known in the semiconductor processing art. It is also possible to use an anisotropic etchant, such as any conventional dry anisotropic plasma etching process, to do some of the etching to form the trenches. A combination of isotropic etching and anisotropic etching, in any order, may be used to achieve a wide range of aspect ratios of trench depth to trench width, and sidewall slopes. The selection of a particular aspect ratio for the trenches of the device and combinations of etchants are not critical to practicing the invention, and one of ordinary skill in the art may select these features for a particular device design without undue experimentation.

Figure 8:
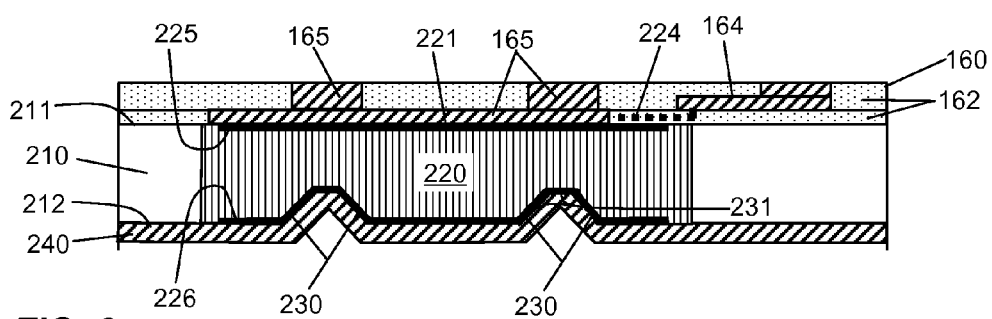

Referring to FIG. 8, a layer 240 of conductive material, such as one or more sub-layers of metal, may be formed over the surfaces of trenches 230 and the remaining portions of the bottom surface of the wafer (same as second surface 212). Any conventional formation process may be used, such as sputtering, evaporation followed by electroplating, etc. To provide better adhesion for conductive layer 240, the surfaces of trenches 230 and the wafer's bottom surface may be roughened by exposing these surfaces to an etchant prior to forming conductive layer 240. For a silicon wafer, a brief etch in tetra-methyl ammonium hydroxide (TMAH) may be used (in less time than needed to etch trenches 230). As is known in the art, TMAH can be isotropic, anisotropic, or a blend of these characteristics, depending upon concentration and etch temperature. The TMAH etchant may be provided at a concentration (in water) and temperature known to the art that etches silicon at a rate of 1.5 to 5 microns per minute with mainly anisotropic etching behavior (e.g., ~75%) but with some isotropic etching behavior (e.g., ~25%). The outermost sublayer of conductive layer 240 may comprise copper, and the cooper sub-layer may be processed with the above-described underbump metal process or electroless nickel immersion gold process (ENIG) for a durable finish. (Layer 140 and the exposed portions of traces 164-166 may be so processed at the same time.)

Figure 9:
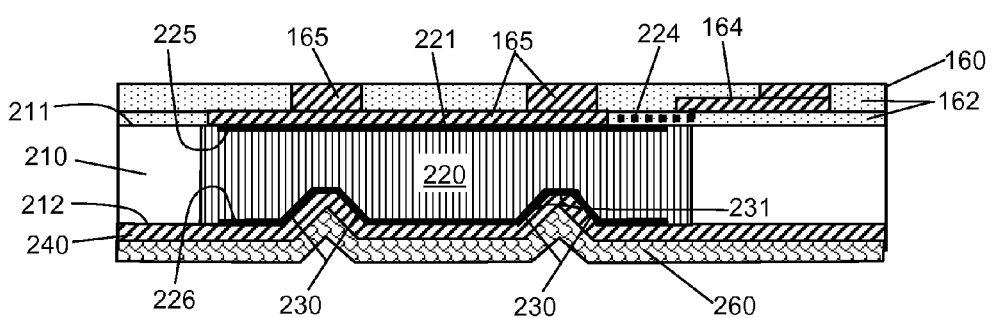
Figure 10:
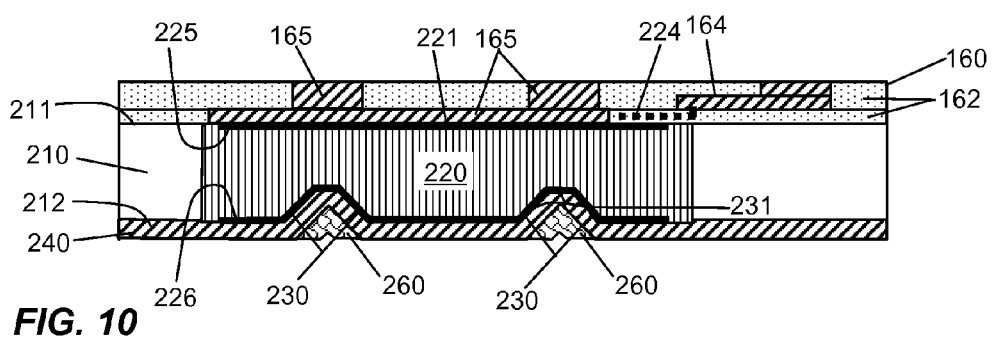

Referring to FIG. 9, a layer 260 of elastic conductive material is disposed on layer 240, at least partially filling the voids created by trenches 230. Layer 260 will subsequently provide a portion of second layer 245. Layer 260 may comprise a silver paste, and may be disposed by spin coating, followed by partially curing or fully curing. A planarizing etch back process is performed to remove portions of silver paste that are formed on second surface 212 of the device. The results of the planarization action are shown in FIG. 10. The DFS8910 surface planer manufactured by DISCO Corporation may be used. This equipment uses a diamond bit to provide high-precision planarization. The planarization exposes portions of layer 240, which can be marked with package information by laser marking. It also ensures that the package's back surface can be stably mounted to a leadframe, interconnect substrate, or the like, without the presence of air bubbles caused by the voids of trenches 230. If needed, the above ENIG treatment may be repeated prior to the laser marking, or done after the planarization and prior to marking.

Figure 11:
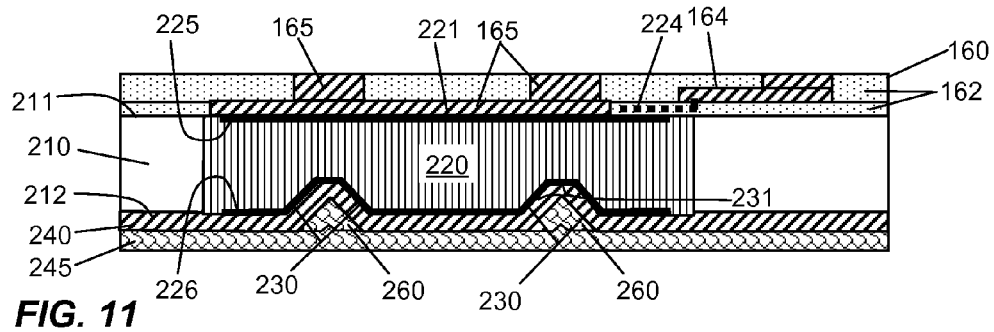

Referring to FIG. 11, layer 245 of elastic conductive material is disposed on layer 240 and the remaining portions of layer 260, which fills any dips in layer 260 and provides a planar surface of elastic conductive material Layer 245 may comprise a silver paste, and may be disposed by spin coating, followed by partially curing or fully curing. If trenches 230 are deep and layer 245 cannot fully fill the dips in layer 260, a second layer similar to layer 260 may be disposed on planarized layer 260, at least partially cured, and thereafter planarized before layer 245 is formed.

Referring back to FIG. 1, interconnect bumps 174-175 may be disposed on the top portion of traces 164-165 by any conventional bump deposition process. Prior to bump deposition, the top portions of traces 164-165 may be treated with an underbump metal process or an electroless nickel immersion gold process (ENIG), as described above, if they were not previously so treated. For this, the traces 164-165 preferably comprise copper. The complete die packages may then be separated by dicing or the like.

Figure 12:
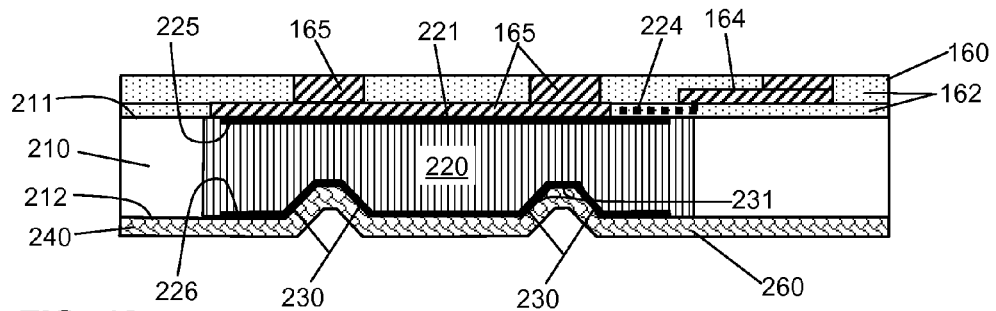
Figure 13:
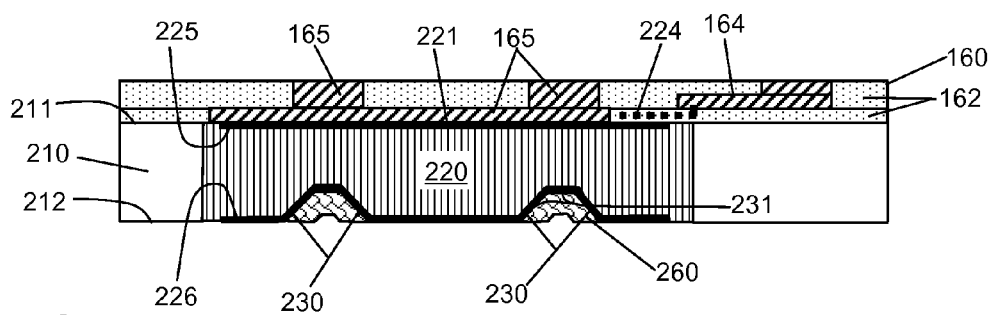
Figure 14:
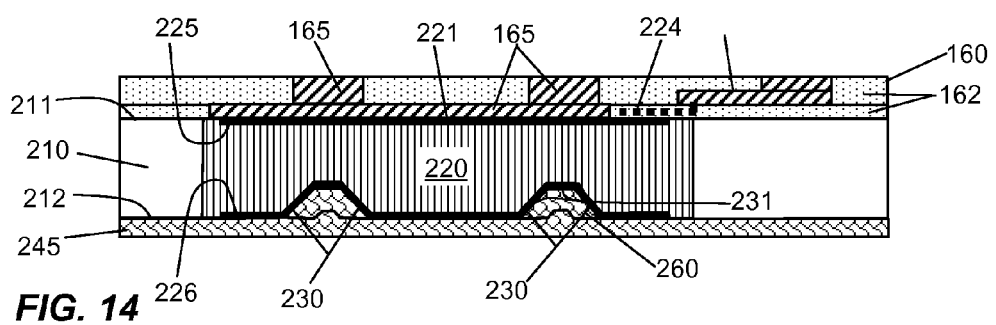

Another method embodiment according to the invention comprises the above-described method without disposing first conductive layer 240, but with disposing layer 260 and second conductive layer 245 directly on the semiconductor back surface and in trenches 230. A slightly higher on-state resistance may occur, but manufacturing effort and costs are reduced. Referring to FIG. 12, after forming trenches 230, layer 260 of elastic conductive material is disposed on the back surface 212 of die 210 and in trenches 230, at least partially filling the voids created by trenches 230. To provide better adhesion for layer 260, the surfaces of trenches 230 and the wafer's bottom surface 212 may be roughened by exposing these surfaces to an etchant prior forming layer 260. For a silicon wafer, a brief etch in tetra-methyl ammonium hydroxide (TMAH) may be used. Referring to FIG. 13, layer 160 may be planarized, as described above. Referring to FIG. 14, layer 245 may be formed, as described above.

It should be understood that where the performance of an action (such as the underbump metal or ENIG process) of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

The semiconductor die packages described above can be used in electrical assemblies including circuit boards with the packages mounted thereon. They may also be used in systems such as phones, computers, etc. It may be appreciated that more than additional semiconductor dice may be assembled with each package to provide greater functionality and circuit density.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A method of manufacturing a semiconductor die comprising a semiconductor substrate having a first surface, a second surface opposite to the first surface, a semiconductor device region extending from the first surface toward the second surface, and at least one electrode disposed at the first surface, the method comprising:
    forming at least one trench at the second surface of the semiconductor die, the trench extending toward the semiconductor device region; and
    forming an electrically conductive layer over the at least one trench and the second surface of the semiconductor substrate, the electrically conductive layer comprising a polymer.

2. The method of claim 1, wherein the electrically conductive layer comprises a metal filled polymer.

3. The method of claim 1, wherein forming the at least one trench comprises exposing the die's second surface to an isotropic etchant through a patterned mask.

4. The method of claim 1, wherein forming the electrically conductive layer comprises:
    exposing the at least one trench and the second surface of the semiconductor substrate to an etchant, and
    forming the electrically conductive layer over the etched surfaces of the at least one trench and second surface of the semiconductor substrate by spin coating.

5. The method of claim 1, wherein forming the electrically conductive layer comprises:

forming a first electrically conductive layer over the at least one trench and the second surface of the semiconductor substrate, the first electrically conductive layer comprising a polymer;

removing portions of the first electrically conductive layer that are disposed on the second surface of the semiconductor substrate; and forming a second electrically conductive layer over the remaining portions of the first electrically conductive layer, and over the exposed portions of the second surface of the semiconductor substrate, the second electrically conductive layer comprising a polymer.

6. The method of claim 5, further comprising at least partially curing the first electrically conductive layer before removing portions of the first electrically conductive layer that are disposed on the second surface of the semiconductor substrate.

7. The method of claim 1, further comprising forming a metal layer over the at least one trench and the second surface of the semiconductor substrate prior to forming the electrically conductive layer, and wherein forming the electrically conductive layer is formed over the metal layer.

8. The method of claim 1, further comprising forming a packaging layer on the first surface of the semiconductor substrate, the packaging layer comprising at least one dielectric layer and a plurality of conductive traces.

9. The method of claim 1, further comprising manufacturing the device region.

10. A method of manufacturing a semiconductor die comprising a semiconductor substrate having a first surface, a second surface opposite to the first surface, a semiconductor device region extending from the first surface toward the second surface, and at least one electrode disposed at the first surface, the method comprising:

forming at least one trench at the second surface of the semiconductor die, the trench extending toward the semiconductor device region;

forming a first electrically conductive layer over the at least one trench and the second surface of the semiconductor substrate, the electrically conductive layer comprising a metal; and forming a second electrically conductive layer over the first electrically conductive layer, the electrically conductive layer comprising a polymer and having a greater material elasticity than the first electrically conductive layer.

* * * * *